United States Patent
Hoffman et al.

(10) Patent No.: US 7,309,895 B2
(45) Date of Patent: Dec. 18, 2007

(54) SEMICONDUCTOR DEVICE

(75) Inventors: Randy Hoffman, Corvallis, OR (US); Peter Mardilovich, Corvallis, OR (US); Gregory Herman, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/043,647

(22) Filed: Jan. 25, 2005

(65) Prior Publication Data

US 2006/0163655 A1 Jul. 27, 2006

(51) Int. Cl.
*H01L 31/0392* (2006.01)

(52) U.S. Cl. .................. 257/347; 257/432; 257/59; 257/72; 257/347; 257/E29.068; 257/E29.139; 257/E29.299

(58) Field of Classification Search .............. 257/43, 257/39, 59, 72, 347, E27.112, E27.116, E29.291, 257/E29.299, E29.068, E29.139
See application file for complete search history.

(56) References Cited

U.S. PATENT DOCUMENTS

| | | | |
|---|---|---|---|
| 5,744,824 A | 4/1998 | Kousai et al. | |
| 5,744,864 A * | 4/1998 | Cillessen et al. | 257/749 |
| 6,326,248 B1 | 12/2001 | Ohtani et al. | |
| 6,548,331 B2 | 4/2003 | Lee et al. | |
| 6,586,287 B2 | 7/2003 | Joo et al. | |
| 6,727,121 B2 | 4/2004 | Joo et al. | |
| 6,727,522 B1 | 4/2004 | Kawasaki et al. | |
| 6,864,130 B2 * | 3/2005 | Koo et al. | 438/166 |
| 2002/0192884 A1 | 12/2002 | Chang et al. | |
| 2004/0110329 A1 | 6/2004 | Joo et al. | |
| 2004/0125265 A1 | 7/2004 | Koo et al. | |
| 2004/0142528 A1 | 7/2004 | Bhattacharyya | |
| 2004/0155270 A1 | 8/2004 | Hoffman | |
| 2004/0155846 A1 | 8/2004 | Hoffman et al. | |

FOREIGN PATENT DOCUMENTS

JP 200228516 8/2000

OTHER PUBLICATIONS

Hideo Hosono, Mashahiro Yasukawa, Hiroshi Kawazoe; "Novel oxide amorphous semiconductors: Transparent conducting amorphous oxides" Journal of Non-Crystalline Solids, North-Holland Physics Publishing. Amsterdam; pp. 334-344.

Ohta, et al; "Frontier of transparent oxide semiconductors Solid State Electronics"; Elsevier Science Publishers Barking, GB, vol. 47 No. 12; Dec. 2003; pp. 2261-2267.

Clayton, et al; "Synthesis and processing of AgInO2 delafossite compoundsby cation exchange reacitons" Preparation and Characterization, Elsevier Sequoia, NL; vol. 411, No. 1 May 22, 2002; pp. 140-146.

(Continued)

*Primary Examiner*—Minhloan Tran
*Assistant Examiner*—Benjamin Tzu-Hung Liu

(57) ABSTRACT

An exemplary embodiment includes a semiconductor device. The semiconductor device can include a channel including one or more compounds of the formula $A_xB_xO_x$, wherein each A is selected from the group of Cu, Ag, Sb, each B is selected from the group of Cu, Ag, Sb, Zn, Cd, Ga, In, Ge, Sn, and Pb, each O is atomic oxygen, each x is independently a non-zero integer, and each of A and B are different.

34 Claims, 6 Drawing Sheets

OTHER PUBLICATIONS

Ibuki et al; "Preparation of n-type conductive transparent thin films of AgInO2:Sn with delafossite-type structure"; Journal of Applied Physics, American Institute of Physics, NY US vol. 88 No. 5, Sep. 1, 2000; pp. 3067-3069.

Kudo, et al; "Fabrication of transparent p-n heterojunction thin film diodes based entirely on oxide semiconductor"; Appl Physics Lettrs, AIP, American Appl Inst of Physics, Melville, NY, US, vol. 75, No. 18; Nov. 1, 1999; pp. 2851-2853.

Otabi, et al; "n-type electrical conduction in transparent thin films of delafossite-type AgInO2" Appl Phys Ltrs, AIP Amer Inst Physics, Melville NY US vol. 72 No. 9 Mar 2, 1998; pp. 1036-1038.

Vaivars, et al; "Synthesis, structure and conductivity of Ag27nSiO4, Ag27nGeO4 and Ag2BeSiO4" Solid State Ionics, North Holland Pub Co, Amsterdam NL vol. 78 No. 3 Jun. 1995; pp. 259-267.

Yanagi, et al; "Bipolarity in electrical conduction of transparent oxide semiconductor CuInO2 with delafossite structure"; Appl Physics Ltrs AIP American Inst Of Physics, Melville NY US vol. 78 No. 11; Mar. 12, 2001; pp. 1583-1585.

Giesbers, et al; "Dry etching of all-oxide transparent thin film memory transistors"; Microelectronic Engineering, Elsevier Publishers VB, Amsterdam NL vol. 35 No. 1, Feb. 1997; pp. 71-74.

* cited by examiner

SEMICONDUCTOR DEVICE

BACKGROUND

Semiconductor devices are used in a variety of electronic devices. For example, thin-film transistor technology can be used in liquid crystal display (LCD) screens. Some types of thin-film transistors have relatively slow switching speeds because of low carrier mobility. In some applications, such as LCD screens, use of thin-film transistors with relatively slow switching speeds can make it difficult to accurately render motion.

SUMMARY

A semiconductor device can include a channel including one or more compounds of the formula $A_xB_xO_x$, wherein each A is selected from the group of Cu, Ag, Sb, each B is selected from the group of Cu, Ag, Sb, Zn, Cd, Ga, In, Ge, Sn, and Pb, each O is atomic oxygen, each x is independently a non-zero integer, and each of A and B are different.

BRIEF DESCRIPTION OF THE DRAWINGS

The accompanying drawings illustrate various embodiments of the present system and method and are a part of the specification. The illustrated embodiments are merely examples of the present system and method and do not limit the scope thereof.

Throughout the drawings, identical reference numbers designate similar, but not necessarily identical, elements.

DETAILED DESCRIPTION

Figure 1A:
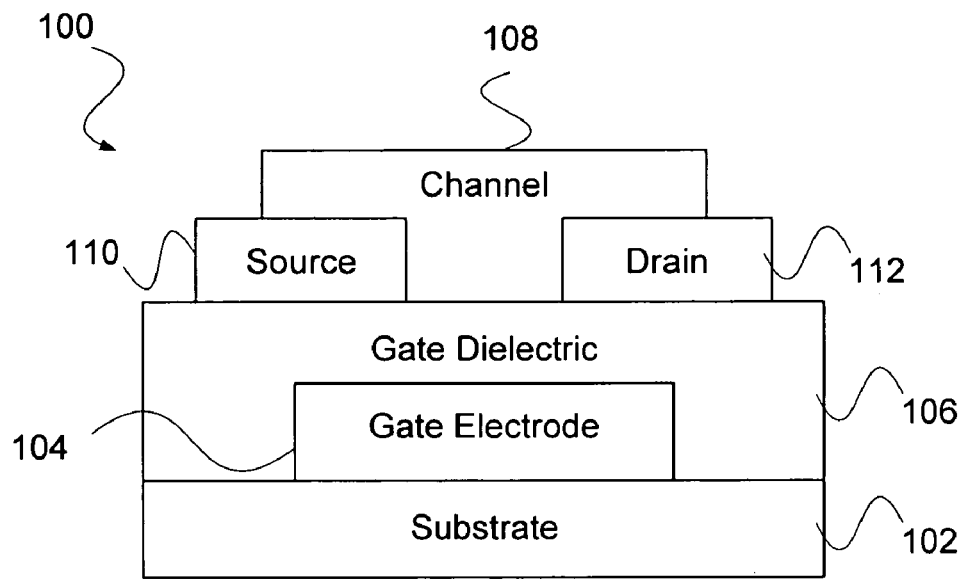
FIGS. 1A-1F illustrate various embodiments of a semiconductor device, such as a thin-film transistor.

An exemplary semiconductor device is disclosed herein that includes semiconductor devices, such as transistors that contain multi-cation oxide semiconductors. Additionally, exemplary embodiments of the present disclosure account for the properties possessed by transistors that contain multi-cation oxide semiconductors, e.g. optical transparency, and electrical performance. Exemplary embodiments include semiconductor devices that contain a multi-cation channel including at least two cations to form various two, three, four, and/or five-cation oxide semiconductor films. The at least two cations include at least one metal cation from the group Cu, Ag, and Sb. In some of the exemplary embodiments, the channel can include a multi-cation oxide that may include an amorphous form, a single-phase crystalline state, or a mixed-phase crystalline state. As used herein, the terms multi-cation oxide, and multi-cation oxide material, are intended to mean oxide material systems that can include two, three, four, and five-cation oxide materials formed from at least one metal cation from the group copper (Cu), silver (Ag), and antimony (Sb).

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It should be understood that the various transistor structures may be employed in connection with the various embodiments of the present disclosure, i.e., semiconductor structures, field effect transistors including thin-film transistors, active matrix displays, logic inverters, and amplifiers. FIGS. 1A-1F illustrate exemplary thin-film transistor embodiments. The thin-film transistors can be of any type, including but not limited to, horizontal, vertical, coplanar electrode, staggered electrode, top-gate, bottom-gate, single-gate, and double-gate, to name a few.

As used herein, a coplanar electrode configuration is intended to mean a transistor structure where the source and drain electrodes are positioned on the same side of the channel as the gate electrode. A staggered electrode configuration is intended to mean a transistor structure where the source and drain electrodes are positioned on the opposite side of the channel as the gate electrode.

In the following description, for purposes of explanation, numerous specific details are set forth in order to provide a thorough understanding of the present system and method for forming an exemplary semiconductor device, such as transistors that contain multi-cation oxide semiconductors having least two cations, at least one of the cations being a metal cation from a first group consisting of Cu, Ag, and Sb; and at least a second cation being selected from the group of the remaining cations in the first group or one of a second group consisting of zinc (Zn), cadmium (Cd), gallium (Ga), indium (In), germanium (Ge), tin (Sn), and lead (Pb). It will be apparent, however, to one skilled in the art, that the present method may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

Exemplary Structure

Figure 1B:
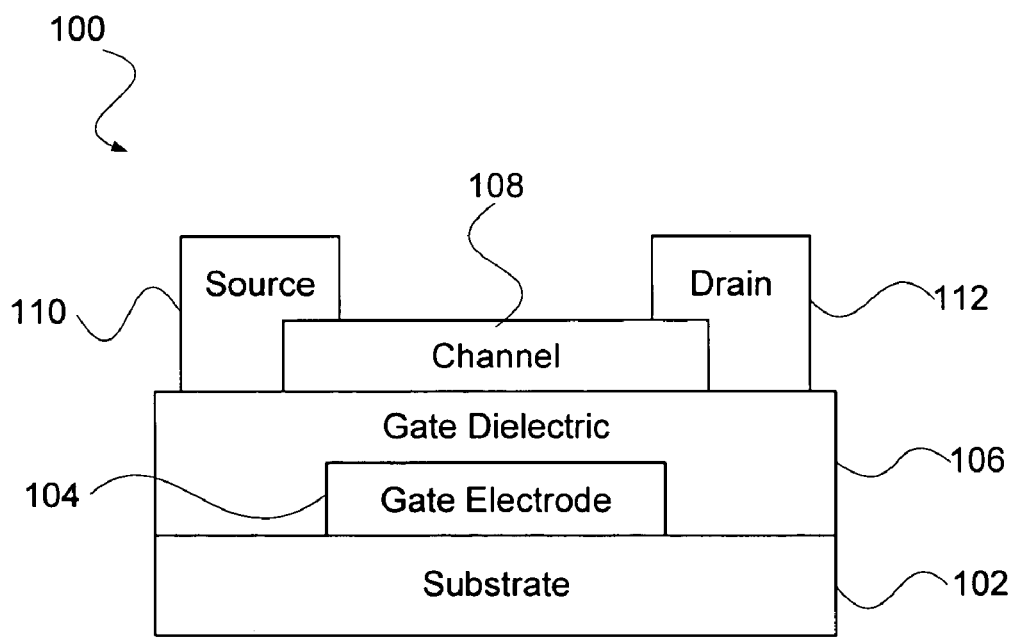
Figure 1C:
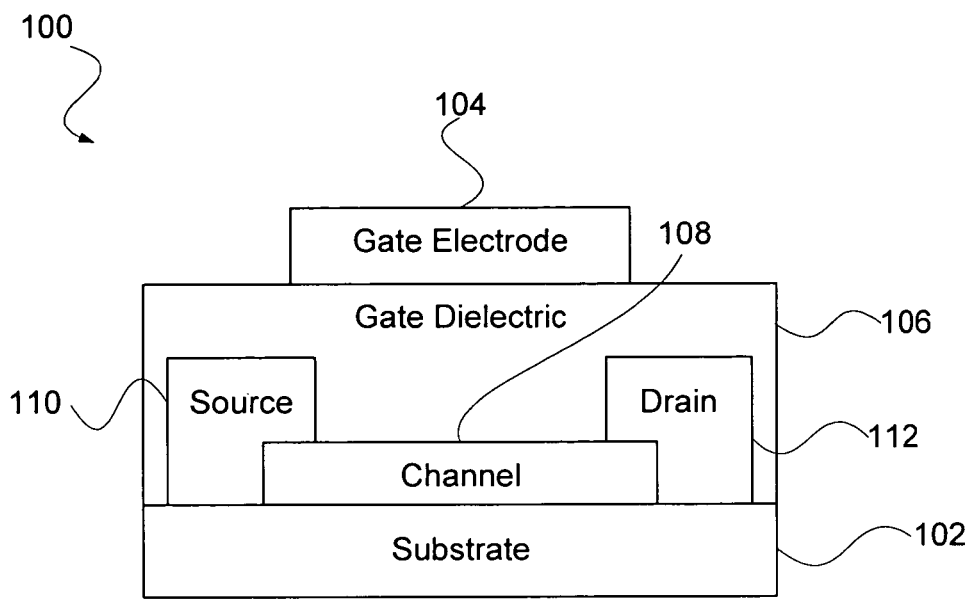
Figure 1D:
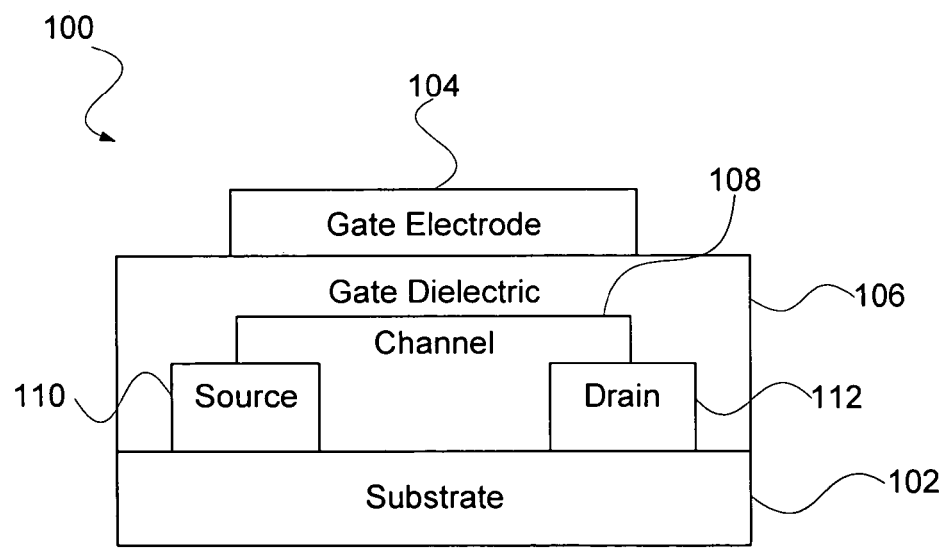
Figure 1E:
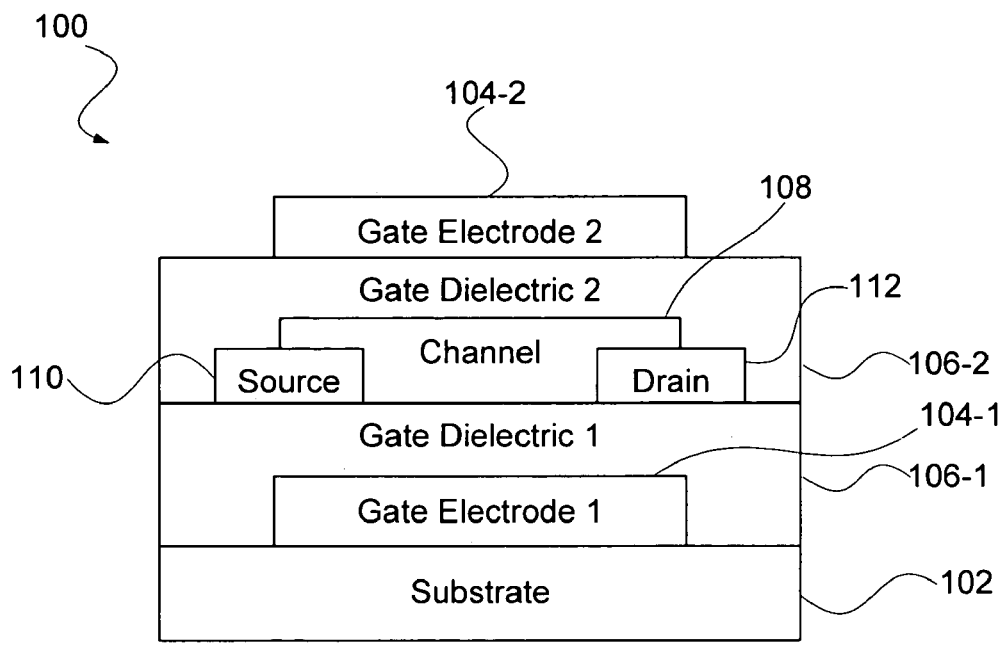
Figure 1F:
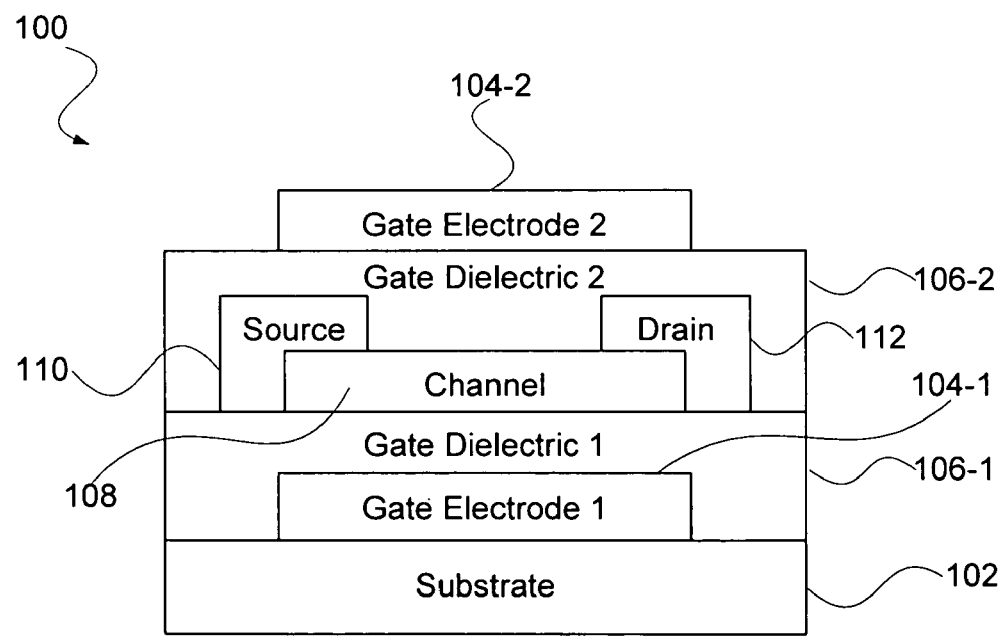

FIGS. 1A and 1B illustrate embodiments of bottom-gate transistors, FIGS. 1C and 1D illustrate embodiments of top-gate transistors, and FIGS. 1F and 1F illustrate embodiments of double-gate transistors, according to a number of exemplary embodiments. In each of FIGS. 1A-1D, the transistors include a substrate (102), a gate electrode (104), a gate dielectric (106), a channel (108), a source electrode (110), and a drain electrode (112). Further, in each of FIGS. 1A-1D, the gate dielectric (106) is positioned between the gate electrode (104) and the source and drain electrodes (110, 112) such that the gate dielectric (106) physically separates the gate electrode (104) from the source and the drain electrodes (110, 112). Additionally, in each of the FIGS. 1A-1D, the source and the drain electrodes (110, 112) are separately positioned thereby forming a region between the source and drain electrodes (110, 112) for interposing the channel (108). Consequently, in each of FIGS. 1A-1D, the gate dielectric (106) is positioned adjacent the channel (108), and physically separates the source and drain electrodes (110, 112) from the gate electrode (104). Additionally, the channel (108) is positioned adjacent the gate dielectric (106) and is interposed between the source and drain electrodes (110, 112).

In various exemplary embodiments, such as in the double-gate embodiments shown in FIGS. 1E and 1F, two gate electrodes (104-1, 104-2) and two gate dielectrics (106-1, 106-2) are illustrated. In such embodiments, the positioning of the gate dielectrics (106-1,106-2) relative to the channel (108) and the source and drain electrodes (110, 112), and the positioning of the gate electrodes (104-1, 104-2) relative to the gate dielectrics (106-1, 106-2) follow the same positioning convention described above where one gate dielectric and one gate electrode are illustrated. That is, the gate dielectrics (106-1, 106-2) are positioned between the gate electrodes (104-1, 104-2) and the source and drain electrodes (110, 112) such that the gate dielectrics (106-1, 106-2) physically separate the gate electrodes (104-1, 104-2) from the source and the drain electrodes (110, 112).

In each of FIGS. 1A-1F, the channel (108) interposed between the source and the drain electrodes (110, 112) provide a controllable electric pathway between the source and drain electrodes (110, 112) such that when an appropriate voltage is applied to the gate electrode (104), an electrical charge can move between the source and drain electrodes (110, 112) via the channel (108). The voltage applied at the gate electrode (104) can vary the ability of the channel (108) to conduct the electrical charge and thus, the electrical properties of the channel (108) can be controlled, at least in part, through the application of a voltage at the gate electrode (104).

Figure 2:
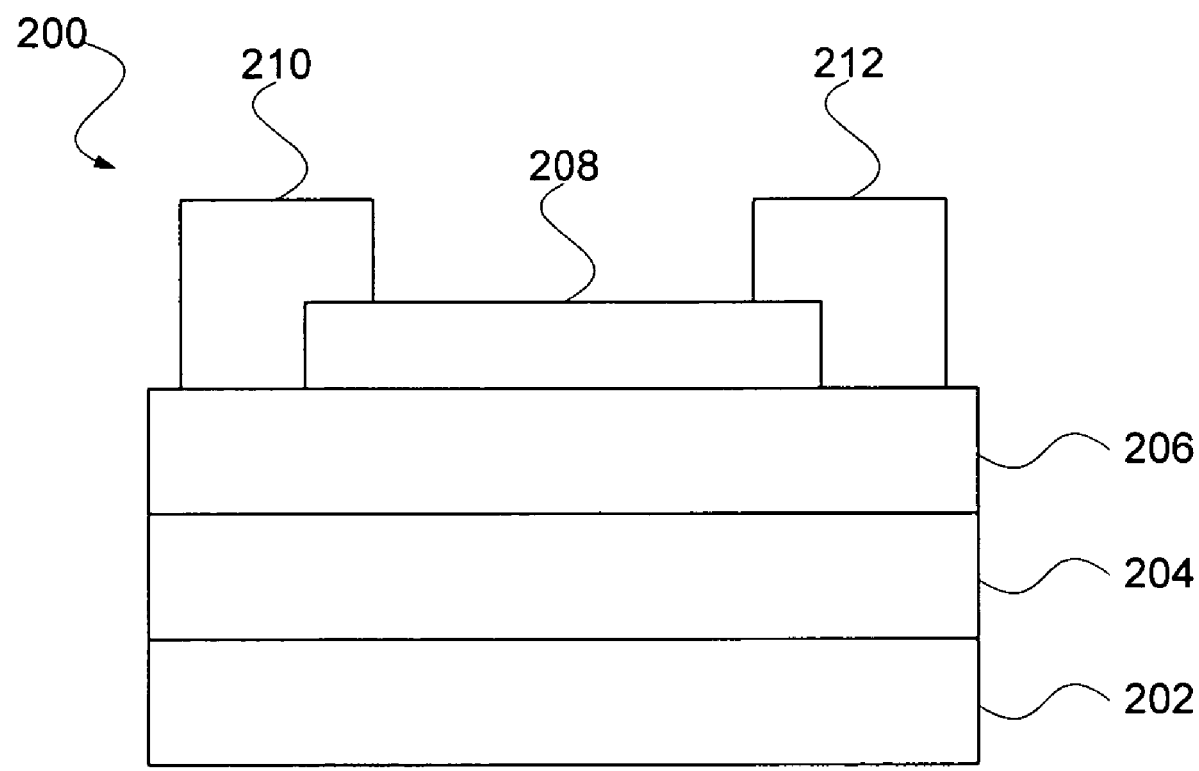
FIG. 2 illustrates a cross-sectional schematic of an embodiment of a thin-film transistor, according to one exemplary embodiment.

A detailed cross-sectional view of an exemplary bottom gate thin-film transistor (200) is illustrated in FIG. 2. It will be appreciated that the different layers of the thin-film transistor described in FIG. 2, the materials in which they constitute, and the methods in which they are formed can be equally applicable to any of the transistor embodiments described herein, including those described in connection with FIGS. 1A-1F. Moreover, in the various embodiments, the thin-film transistor (200) can be included in a number of devices including, but in no way limited to, an active matrix display device, such as an active matrix liquid crystal display (AMLCD) device; an active matrix detection device, such as an active matrix x-ray detector device; a logic gate, such as a logic inverter; and/or an analog circuit, such as an amplifier. The thin-film transistor (200) can also be included in an infrared device where transparent components are also used. Exemplary compositions of the exemplary thin-film transistor (200) will now be described in detail below.

Exemplary Composition

As shown in FIG. 2, the thin-film transistor (200) can include a substrate (202), a gate electrode (204) positioned adjacent the substrate (202), a gate dielectric (206) positioned adjacent the gate electrode (204), a channel (208) positioned between the gate dielectric (206), a source electrode (210), and a drain electrode (212). In the exemplary embodiment shown in FIG. 2, the substrate (262) includes glass. However, substrate (202) can include any suitable substrate material or composition for implementing the various embodiments.

The substrate (202) illustrated in the exemplary embodiment of FIG. 2 may include a layer of ITO (indium-tin oxide) to form the gate electrode (204) layer. However, any number of materials can be used for the gate electrode (204). Such materials can include transparent conductor materials such as an n-type doped $In_2O_3$, $SnO_2$, ZnO, and the like. Other suitable materials include metals such as Al, Ti, Ag, Cu, Au, Ta, Ni, Mo, and the like. According to one exemplary embodiment, the exemplary gate electrode (204) illustrated in FIG. 2 has a thickness of approximately 200 nm. However, the thickness of a gate electrode layer can vary depending on the materials used, device type, and other factors.

The gate dielectric (206), as shown in FIG. 2, may be blanket coated. Although the gate electrode (204) and gate dielectric (206) are shown as blanket coated, unpatterned layers in FIG. 2, they can alternatively be patterned. In the exemplary embodiments, the gate dielectric layer (206) can include various layers of different materials having insulating properties representative of gate dielectrics. Such materials can include silicon dioxide ($SiO_2$), silicon nitride ($Si_3N_4$), aluminum oxide ($Al_2O_3$), tantalum pentoxide ($Ta_2O_5$), hafnium(IV)oxide ($HfO_2$), zirconium(IV)oxide ($ZrO_2$), strontium titanate (ST), barium strontium titanate (BST), lead zirconium titanate (PZT), strontium bismuth tantalate (SBT), and bismuth zirconium titanate (BZT), magnesium oxide (MgO), various organic dielectric material, and the like.

In one exemplary embodiment, the gate dielectric (206) may be deposited by a low-pressure chemical vapor deposition (CVD) process using $Ta(OC_2H_5)_5$ and $O_2$ at about 430° C., and may be subsequently annealed in order to reduce leakage current characteristics. Other methods for introducing the gate dielectric layer can include various CVD and sputtering techniques and atomic layer deposition (ALD), evaporation, and the like as will be described in more detail herein.

In the present exemplary embodiments, the source electrode (210) and the drain electrode (212) are separately positioned adjacent the gate dielectric (206). In the embodiment shown in FIG. 2, the source and drain electrodes (210, 212) can be formed from the same materials as those discussed in regards to the gate electrode (204). In the embodiment shown in FIG. 2, the exemplary source and drain electrodes (210, 212) have a thickness of approximately 200 nm. However, the thickness can vary depending on composition of material used, application in which the material will be used, and other factors. The choice of source and drain electrode, material can vary depending on the application, device, system, etc., in which they will be used. Overall device performance is likely to vary depending on the source and drain materials. For example, in devices where a substantially transparent thin-film transistor is desired, the materials for the source, drain, and gate electrodes can be chosen for that effect.

According to one exemplary embodiment, the channel (208) can be formed from a multi-cation oxide material comprising a two, three, four, or five-cation oxide that includes at least a first metal cation selected from a first group consisting of Cu, Ag, and Sb; and at least a second cation selected from the group of the remaining cations in the first group or one of a second group consisting of Zn, Cd, Ga, In, Ge, Sn, and Pb. As used herein, a multi-cation oxide is intended to mean a two, three, four, or five-cation oxide, each cation being different, and each multi-cation oxide having at least a first metal cation from a group consisting of Cu, Ag, and Sb; and at least a second cation being selected from the group of the remaining cations in the first group or one of a second group consisting of Zn, Cd, Ga, In, Ge, Sn, and Pb. Thus, a two-cation oxide can include two metal cations, one from the group consisting of Cu, Ag, and Sb and one from the same or another group as long as each metal cation is different. Similarly, a four-cation oxide can include four metal cations, each metal cation being different, and including at least one metal cation from the group consisting of Cu, Ag, and Sb.

In the various embodiments, the channel can be described as including one or more compounds of a formula. In the various embodiments, a formula can be characterized by a series of letters that can include A, B, C, D, E, (representing cations as described herein), and O (atomic oxygen). A formula can also be characterized by a subscript x, e.g. $A_x$. In a formula, the letters, other than O, are intended to denote the identity of the metal cation selected from a defined group, and the subscripts are intended to denote the number of atoms of the metal cation selected from the defined group. For example, if A represents the metal cation Ag, and x represents the number 2, then $A_x$ can include $Ag_2$, i.e., two atoms of Ag.

Additionally, the letter O denotes atomic oxygen as characterized by the symbol O on the periodic table of the elements. Thus, depending on the stoichiometry of a compound derived from a formula, the subscript of O, i.e., $O_x$, in the formula can vary depending on the number of atoms of metal cations included in any given formula. For example, the formula $A_xB_xO_x$ can include the binary metal oxide: silver-lead oxide having the stoichiometric arrangement: $AgPbO_3$, wherein $O_3$ denotes the number of oxygen atoms associated with a chemical reaction between AgO and $PbO_2$. For metals such as Pb where multiple oxides exist, i.e., PbO and $PbO_2$, the stoichiometric arrangement may be written as $AgPbO_{3-\delta}$, wherein $\delta$ indicates that one, multiple, and/or all of the metal cations are not fully oxidized.

In the formulas described herein, at least one metal cation from the group consisting of Cu, Ag, and Sb is included in the multi-cation oxide material. For example, the formula $A_xB_xC_xO_x$, can include a variety of three-cation group consisting of Cu, Ag, and Sb. Thus, in a multi-cation oxide having two, three, four, or five cations, at least a first metal cation from the group consisting of Cu, Ag, and Sb is included. Additionally, where embodiments include formulas for three, four and five-cation oxides, the metal cations defined by a given formula can be further defined in other formulas. Thus, where a three-cation oxide of the formula $A_xB_xC_xO_x$ is defined by certain metal cations, a four-cation oxide of the formula $A_xB_xC_xD_xO_x$, can be defined by the same metal cations defined in the formula $A_xB_xC_xO_x$ and can be further defined by other metal cations. For example, in a four-cation oxide of formula $A_xB_xC_xD_xO_x$, the $A_x$, $B_x$ and $C_x$ can be defined by the same metal cations defined in the formula $A_xB_xC_xO_x$, however the $D_x$ of the four-cation oxide formula can further be defined by other metal cations depending on the embodiment in which it is described. Additionally, a selected metal cation in any given formula is included once. That is, in the formula, $A_xB_xC_xO_x$, if A is selected to be copper (Cu), then neither B nor C can include copper (Cu).

In one exemplary embodiment, the channel (208) can be formed from a multi-cation oxide material that includes one or more compounds of the formula $A_xB_xO_x$, wherein each A can be selected from a first group of Cu, Ag, and Sb; each B can be selected from the group of the remaining cations in the first group or one of a second group consisting of Zn, Cd, Ga, In, Ge, Sn, and Pb; each O can be atomic oxygen; each x can be independently a non-zero integer; and each of A and B are different. That is, the value of "x" for each of the constituent elements may be different. For example, selecting metal cations according to the formula $A_xB_xO_x$, twenty-four two-cation oxides can be formed. The twenty-four two-cation oxides include: copper-zinc oxide, copper-cadmium oxide, copper-gallium oxide, copper-indium oxide, copper-germanium oxide, copper-tin oxide, copper-lead oxide, copper-silver oxide, copper-antimony oxide, silver-zinc oxide, silver-cadmium oxide, silver-gallium oxide, silver-indium oxide, silver-germanium oxide, silver-tin oxide, silver-lead oxide, silver-antimony oxide, antimony-zinc oxide, antimony-cadmium oxide, antimony-gallium oxide, antimony-indium oxide, antimony-germanium oxide, antimony-tin oxide, and antimony-lead oxide. In these embodiments, the one or more compounds of the formula $A_xB_xO_x$ can include an atomic composition characterized by a ratio $A_x:B_x$, wherein a quantity $A_x$ and a quantity $B_x$, in the context of this ratio, are each in a range of about 0.05 to about 0.95. Thus, a copper-zinc oxide can include an atomic composition having a ratio, near ends of a range, of about 0.05:0.95 (copper:zinc) or about 0.95:0.05 (copper:zinc) or ratios of copper/zinc or zinc/copper in between the ratio near the ends of the range. That is, the channel according to this embodiment can include various two-cation oxide semiconductor films having atomic composition ratios with the relative concentration of each cation falling within the range of about 0.05 to about 0.95.

In another exemplary embodiment, the channel (208) can be formed from a multi-cation oxide material that includes one or more compounds of the formula $A_xB_xC_xO_x$. According to this exemplary embodiment, A, B, and C can include those materials selected from the group of Cu, Ag, and Sb, each O can be atomic oxygen, each x can be independently a non-zero integer, and each of A, B, and C are different. Additionally, if at least one of A, B, and C is selected from the group of Cu, Ag, and Sb, the other components may also be selected from the group of Cu, Ag, and Sb or the group of Zn, Cd, Ga, In, Ge, Sn, and Pb, so long as each of A, B, and C are different. That is, the value of "x" for each of the constituent elements may be different and in the exemplary formula $A_xB_xC_xO_x$, if A is copper (Cu), neither B nor C will include copper. In one exemplary embodiment, according to the formula $A_xB_xC_xO_x$, a three-cation oxide can be formed using only cations from the group of Cu, Ag, and Sb. Further, in the present three-cation embodiment, the one or more compounds of the formula $A_xB_xC_xO_x$ can include an atomic composition characterized by a ratio $A_x:B_x:C_x$, wherein a quantity $A_x$, a quantity $B_x$, and a quantity $C_x$, in the context of this ratio, are each in a range of about 0.025 to about 0.95. Thus, for example, a copper-silver-antimony oxide can include an atomic composition having a ratio, near ends of a range, of about 0.025:0.025:0.95 (copper:silver:antimony) or about 0.95:0.025:0.025 (copper:silver:antimony) or about 0.025:0.95:0.025 (copper:silver:antimony) or ratios of copper/silver/antimony in-between the ratio near the ends of the range. That is, the channel according to this exemplary embodiment can include various three-cation oxide semiconductor films having atomic composition ratios with the relative concentration of each cation falling within the range of about 0.025 to about 0.95.

The atomic composition ratios of metal cations for any given two, three, four and five cation oxide is not limited to the ratios in the foregoing embodiments. Rather, in various embodiments, each of the two, three, four, and five-cation oxides can be formed having a variety of atomic composition ratios. For example, a three-cation oxide can include an atomic composition having a ratio of 0.025:0.485:0.49 (copper:silver:antimony). In the various embodiments, the multi-cation oxide can include various morphologies depending on composition, processing conditions, and other factors. The various morphological states can include amorphous states, and polycrystalline states. A polycrystalline state can include a single-phase crystalline state or a mixed-phase crystalline state. Additionally, in the various embodiments, the source, drain, and gate electrodes can include a substantially transparent material. By using substantially transparent materials for the source, drain, and gate electrodes, areas of the thin-film transistor can be transparent to the portion of the electromagnetic spectrum that is visible to the human eye, or other regions of the electromagnetic spectrum that may be of technological interest, i.e., IR and UV radiation. In the transistor arts, devices such as active matrix liquid crystal displays having display elements (pixels) coupled to thin-film transistors (TFT's) having substantially transparent materials for selecting or addressing the pixel to be on or off will benefit display performance by allowing more light to be transmitted through the display.

Referring back to FIG. 2, the channel (208) can be formed from a multi-cation oxide with a channel thickness of approximately 50 nm, according to one exemplary embodiment. However, in various embodiments the thickness of the channel can vary depending on a variety of factors including whether the channel material is amorphous or polycrystalline, and the device in which the channel is to be incorporated.

In this exemplary embodiment, the channel (208) is positioned adjacent the gate dielectric (206) and between the source and drain electrodes (210, 212). An applied voltage at the gate electrode (204) can facilitate charge carrier accumulation or depletion in the channel (208). In addition, the applied voltage can enhance charge carrier injection from the source electrode (210) to the channel (208) and charge carrier extraction therefrom by the drain electrode (212). In the embodiments of the present disclosure, the channel (208) can allow for on/off operation by controlling current flowing between the drain electrode (212) and the source electrode (210) using a voltage applied to the gate electrode (204).

As mentioned previously, the present exemplary embodiment includes a channel (208) that may include a multi-cation oxide material including at least a first metal cation selected from a group consisting of Cu, Ag, and Sb; and at least a second cation being selected from the group of the remaining cations in the first group or one of a second group consisting of Zn, Cd, Ga, In, Ge, Sn, and Pb; to form various multi-cation oxides including two, three, four, and five-cation oxide materials. Additionally, in the various embodiments, each cation in the multi-cation oxide material is different. For example, where a multi-cation oxide includes three metal cations, i.e., a three-cation oxide, the same two cations will not be included in the multi-cation oxide, thus, if copper is included as a first cation in the three-cation oxide, copper will not be included as a second or third cation of the three-cation oxide. In another example, if antimony is a cation of a four-cation oxide, the other three cations of the four-cation oxide will not include antimony.

These atomic compositions do not take into consideration the optional presence of oxygen and other elements. They are merely a representation of the selection of cations for the multi-cation oxide material used for the channel of a thin-film transistor. The multi-cation oxides, as described herein, are expected to provide very satisfactory electrical performance, specifically in the area of channel mobility. Mobility is a characteristic that can help in determining thin-film transistor performance, as maximum operating frequency, speed, and drive current increase in direct proportion to channel mobility. In addition, for certain multi-cation oxides as described herein, the channel can be transparent in one or more of the ultraviolet, visible and infrared portions of the electromagnetic spectrum, allowing for an entire thin-film transistor to be optically transparent, for example, throughout the visible region of the electromagnetic spectrum.

The use of the multi-cation oxide illustrated in the embodiments of the present disclosure is beneficial for a wide variety of thin-film applications in integrated circuit structures. For example, such applications include transistors such as thin-film transistors, horizontal transistors, vertical transistors, coplanar electrode transistors, staggered electrode transistors, top-gate transistors, bottom-gate transistors, single-gate transistors, and double-gate transistors, to name a few. In the present exemplary embodiment, transistors (e.g., thin-film-transistors) of the present disclosure can be provided as switches or amplifiers, where applied voltages to the gate electrodes of the transistors can affect a flow of charge carriers through the channel. The transistors described herein can operate in a variety of ways. For example, the transistor can operate in the saturation region or in the linear region, depending on the particular application. In addition, transistors incorporating channels of a multi-cation oxide may be used in integrated circuits and structures incorporating integrated circuits such as visual display panels (e.g., active matrix LCD displays) such as that shown and described in connection with FIG. 4 below. In display applications and other applications, it will often be desirable to fabricate one or more of the remaining thin-film transistor layers, e.g., source, drain, and gate electrodes, to be at least partially transparent.

In FIG. 2, the source electrode (210) and the drain electrode (212) include an ITO layer having a thickness of about 200 nm. In the various embodiments however, the thickness can vary depending on a variety of factors including type of materials, applications, and other factors. In various embodiments, the source and drain electrodes (210, 212), may include a transparent conductor, such as a doped wide-bandgap semiconductor. Examples include, but are not limited to, doped $In_2O_3$, $SnO_2$, indium-tin oxide (ITO), ZnO, and the like. The source and drain electrodes (210, 212) may also include a metal such as, Al, Ti, Ag, Cu, Au, Pt, W, Ni, and the like. In the various embodiments of the present disclosure, all of the electrodes (204, 210, and 212) may include transparent materials such that the various embodiments of the transistors may be made substantially transparent.

Exemplary Formation

The various layers of the transistor structures described herein can be formed using a variety of techniques. For example, the gate dielectric (206) may be deposited by a low-pressure CVD process using $Ta(OC_2H_5)_5$ and $O_2$ at about 430° C., and may be subsequently annealed in order to reduce leakage current characteristics. Thin-film deposition techniques such as evaporation (e.g., thermal, e-beam), sputtering (e.g., dc sputtering, dc-pulsed sputtering, rf magnetron sputtering, ion beam sputtering, and/or reactive sputtering), chemical vapor deposition (CVD), atomic layer deposition (ALD), pulsed laser deposition (PLD), molecular beam epitaxy (MBE), and the like may be employed. Additionally, alternate methods may also be employed for forming the various transistor layers of the embodiments of the present disclosure. Such alternate methods can include anodization (electrochemical oxidation) of a metal film, as well as deposition from a liquid precursor such as spin coating and ink-jet printing, including continuous inkjet or drop-on-demand printing such as thermal and piezoelectric printing. Film patterning may employ photolithography combined with etching or lift-off processes, or may use alternate techniques such as shadow masking or direct, additive deposition techniques such as drop-on-demand printing. Doping of one or more of the layers (e.g., the channel illustrated in FIG. 2) may also be accomplished by the introduction of oxygen non-stoichiometry (i.e., deficiency or excess) and/or substitution of aliovalent elements.

Embodiments of the present disclosure also include methods of forming metal containing films on a surface of a substrate or substrate assembly, such as a silicon wafer, with or without layers or structures formed thereon, used in forming integrated circuits, and in particular thin-film transistors as described herein. It is to be understood that methods of the present disclosure are not limited to deposition on silicon wafers; rather, other types of substrate materials (e.g., glass, quartz, metal foils, various organic substrate materials, etc.) can be used as well.

Furthermore, other substrates can also be used in methods of the present disclosure. These include, for example, fibers, wires, etc. In general, the films can be formed directly on the lowest surface of the substrate, or they can be formed on any of a variety of the layers (i.e., surfaces) as in a patterned wafer, for example.

Figure 3:
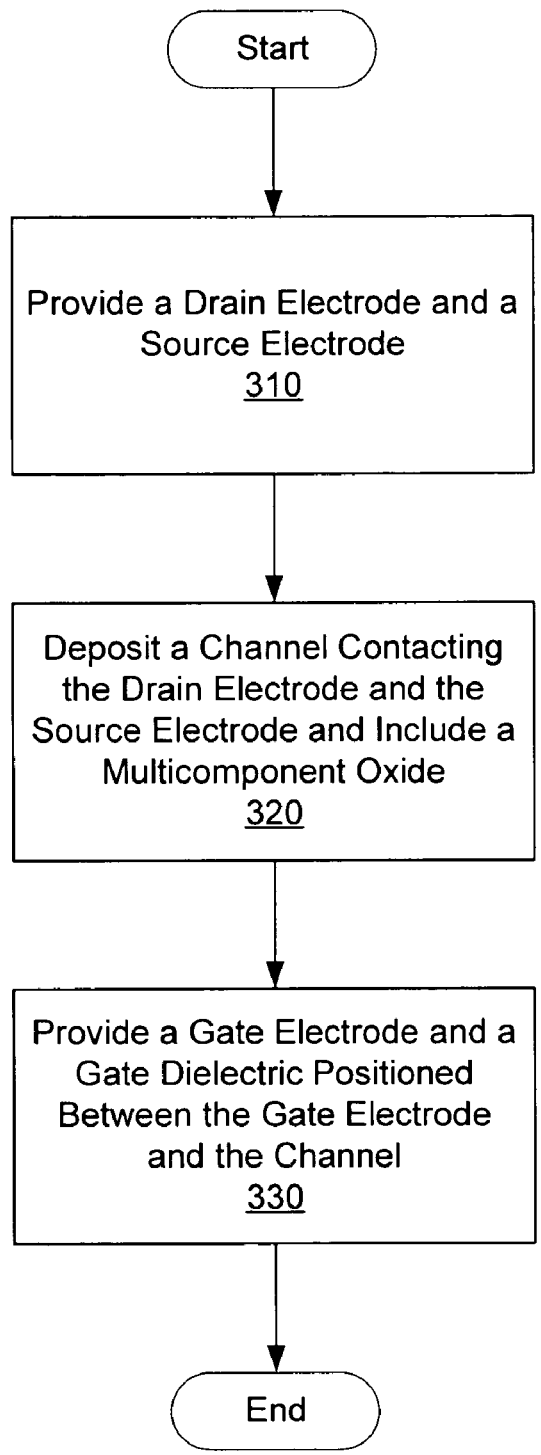
FIG. 3 illustrates a method for manufacturing a thin-film transistor, according to one exemplary embodiment.

In FIG. 3, an exemplary method for fabricating a semiconductor device is illustrated. While the exemplary method illustrated in FIG. 3 illustrates one exemplary fabrication method, additional processing steps may also be taken including, but in no way limited to, thermal annealing and/or patterning processes. Additionally, while the exemplary method illustrated in FIG. 3 is described herein in a specific order, one of ordinary skill in the art will recognize that the illustrated method may be performed with a number of order variations or the omission of a number of the illustrated steps. In the various embodiments of the present disclosure, a substrate or substrate assembly can be provided in forming the semiconductor device. As used herein, the term "substrate" refers to the base substrate material layer, e.g., the lowest layer of glass material in a glass wafer. The term "substrate assembly" refers to the substrate having one or more layers or structures formed thereon. Examples of substrate types include, but are not limited to, glass, plastic, and metal, and include such physical forms as sheets, films, and coatings, among others, and may be opaque or substantially transparent.

As illustrated in FIG. 3, a drain electrode and a source electrode are both provided (step 310). For example, both the drain electrode and the source electrode can be provided on the base substrate material layer as described above.

Once the drain electrode and the source electrode are provided, a channel contacting the drain electrode and the source electrode, and including a multi-cation oxide, can be deposited (step 320). According to one exemplary embodiment, the channel can be deposited between the drain electrode and a source electrode as a precursor compound so as to electrically couple the two electrodes. In the various embodiments, precursor compounds are described as metals, oxides of metals, multi-cation oxides, and formulas having letters and subscripts. In formulas, the letters, e.g., A, are intended to denote a metal cation selected from a defined group and the subscripts, e.g., x, are intended to denote the number of atoms of the metal cation selected from the defined group. Additionally, a compound as used herein can include, but are in no way limited to, two or more elements including at least one metal cation from the group consisting of copper, silver, and antimony; and oxygen. The precursor compounds described herein do not indicate the presence of $O_x$, however, as one of ordinary skill will understand the precursor compounds can also include oxygen to provide the oxide of the compound. The below described method is not intended to limit the compounds by excluding oxygen. As one of ordinary skill will understand, oxygen can be included in the precursor compounds in the various deposition techniques described herein.

Various combinations of the precursor compounds described herein can be used in a precursor composition. Thus, as used herein, a "precursor composition" refers to a solid or liquid that includes one or more precursor compounds described herein optionally mixed with one or more precursor compounds other than those described herein. For example, zinc precursor compounds and lead precursor compounds can be provided in one precursor composition or in separate compositions. Where they are included in separate compositions, both precursor compositions are included when a channel is deposited.

According to one exemplary embodiment, depositing the channel contacting the drain electrode and the source electrode can include providing at least one precursor composition including one or more precursor compounds that include $A_x$ and one or more precursor compounds that include $B_x$. In these embodiments, each A can be selected from a first group Cu, Ag, and Sb; and each B can be selected from the group of the remaining cations in the first group or from a second group consisting of Zn, Cd, Ga, In, Ge, Sn, and Pb; each x is independently a non-zero integer, and wherein each of A and B are different. That is, the value of "x" for each of the constituent elements may be different. Thus, in these embodiments, twenty-four two-cation oxides can be formed. For example, silver (Ag) precursor compounds and antimony (Sb) precursor compounds can be provided in one precursor composition or in separate compositions. In any event, at least one metal cation from a group defined by A and at least one metal cation from a group defined by B can be provided to form one or more precursor compositions of one or more compounds of $A_x$ and $B_x$.

Additionally, in another exemplary embodiment, the precursor composition can further include one or more precursor compounds that include $C_x$. In these embodiments, each C can be selected from among the remaining cations (i.e., those not yet selected for A and B) in the first group and the remaining cations in the second group, each x is independently a non-zero integer, and each of A, B, and C are different. That is, the value of "x" for each of the constituent elements may be different. For example, in various embodiments, the precursor composition can include one or more compounds that include $A_x$, $B_x$, and $C_x$. In such embodiments, three metal cations represented by A, B, and C above can be provided to form one or more precursor compositions of one or more compounds of $A_x$, $B_x$, and $C_x$.

In yet another exemplary embodiment, the precursor composition can further include one or more precursor compounds that include $D_x$. In such embodiments, D can be selected from among the remaining cations in the first group and the remaining cations in the second group, each x is independently a non-zero integer, and each of A, B, C, and D are different. That is, the value of "x" for each of the constituent elements may be different. For example, in various embodiments, the precursor composition can include one or more compounds that include $A_x$, $B_x$, $C_x$, and $D_x$. In such embodiments, four metal cations represented by A, B, C, and D above can be provided to form one or more precursor compositions of one or more compounds of $A_x$, $B_x$, $C_x$, and $D_x$.

In yet another exemplary embodiment, the precursor composition can further include one or more precursor compounds that include $E_x$. In such embodiments, E can be selected from among the remaining cations in the first group and the remaining cations of the second group, each x is independently a non-zero integer, and each of A, B, C, D, and E are different. That is, the value of "x" for each of the constituent elements may be different. For example, in various embodiments, the precursor composition can include one or more compounds that include $A_x$, $B_x$, $C_x$, $D_x$ and $E_x$. In such embodiments, five metal cations represented by A, B, C, D, and E can be provided to form one or more precursor composition of one or more compounds of $A_x$, $B_x$, $C_x$, $D_x$ and $E_x$.

As used herein, "liquid" refers to a solution or a near liquid (a liquid at room temperature or a solid at room temperature that melts at an elevated temperature). As used herein, a "solution" does not call for complete solubility of the solid; rather, the solution may have some undissolved material. The precursor compounds as used herein can also include one or more organic solvents suitable for use in a chemical vapor deposition system, as well as other additives, such as free ligands, that assist in the vaporization of the desired precursor compounds.

A wide variety of Cu, Ag, and Sb; as well as Zn, Cd, Ga, In, Ge, Sn, and Pb precursor compounds suitable for thin-film deposition techniques can be used with the embodiments of the present disclosure. Examples of the precursor compounds include, but are not limited to, the metals and oxides of the metals, including CuO (cupric oxide), $Cu_2O$ (cuprous oxide), AgO (silver (II) oxide), $Ag_2O$ (silver oxide), SbO (antimony oxide), $Sb_4O_6$ (antimony trioxide), $Sb_4O_1O$ (antimony pentoxide), GaO, $Ga_2O$, $Ga_2O_3$, InO, $In_2O_3$, GeO, $GeO_2$, SnO, $SnO_2$, PbO, $PbO_2$, $Pb_2O_3$, and $Pb_3O_4$ precursor compounds. Although specific precursor compounds are illustrated herein, a wide variety of precursor compounds can be used as long as they can be used in a deposition process. In the various embodiments of the present disclosure, the Cu, Ag, Sb, Zn, Cd, Ga, In, Ge, Sn, and Pb precursor compounds can include neutral precursor compounds and may be liquids or solids at room temperature. If they are solids, they are sufficiently soluble in a solvent to allow for vaporization, they can be vaporized or sublimed, or ablated (e.g., by laser ablation or sputtering) from the solid state, or they have melting temperatures below their decomposition temperatures. Thus, many of the precursor compounds described herein are suitable for use in vapor deposition techniques, such as chemical vapor deposition (CVD) techniques, flash vaporization techniques, bubbler techniques, and/or microdroplet techniques.

The precursor compounds described herein can be used in precursor compositions for ink-jet deposition, sputtering, and vapor deposition techniques (e.g., chemical vapor deposition (CVD) or atomic layer deposition (ALD)). Alternatively, certain precursor compounds described herein can be used in precursor compositions for other deposition techniques, such as spin-coating, and the like. Typically, those precursor compounds containing organic R groups with a low number of carbon atoms (e.g., 1-4 carbon atoms per R group) are suitable for use with vapor deposition techniques. Those precursor compounds containing organic R groups with a higher number of carbon atoms (e.g., 5-12 carbon atoms per R group) are generally suitable for spin-on or dip coating.

As used herein, the term "organic R groups" means a hydrocarbon group (with optional elements other than carbon and hydrogen, such as oxygen, nitrogen, sulfur, and silicon) that is classified as an aliphatic group, cyclic group, or combination of aliphatic and cyclic groups (e.g., alkaryl and aralkyl groups). In the context of the present disclosure, the organic groups are those that do not interfere with the formation of a metal-containing film. They may be of a type and size that do not interfere with the formation of a metal-containing film using chemical vapor deposition techniques. The term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group including, for example, methyl, ethyl, isopropyl, t-butyl, heptyl, dodecyl, octadecyl, amyl, 2-ethylhexyl, and the like. The term "alkenyl group" means an unsaturated, linear or branched hydrocarbon group with one or more carbon-carbon double bonds, such as a vinyl group. The term "alkynyl group" means an unsaturated, linear or branched hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono-or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

Continuing with reference to FIG. 3, the channel can be deposited including the precursor composition to form a multi-cation oxide from the precursor composition to electrically couple a drain electrode and a source electrode. In various embodiments, channel deposition can employ various physical vapor deposition techniques, such as evaporation, including thermal or electron-beam evaporation; sputtering, including dc sputtering, dc-pulsed sputtering, rf sputtering, magnetron sputtering, ion beam sputtering, and/or reactive sputtering; and/or other methods including ink-jet deposition techniques, when the precursor composition includes a liquid form.

In the various embodiments, the multi-cation oxide included in the channel can have a uniform composition throughout its thickness, although this is not a requisite. For example, in a four-cation oxide, a precursor composition including a precursor compound that includes $A_x$ can be deposited first and then a combination of precursor compounds that include $B_x$, $C_x$ and $D_x$ can be deposited to form a four-cation oxide semiconductor film. As will be appreciated, the thickness of the multi-cation oxide channel will be dependent upon the application for which it is used. For example, the thickness can have a range of about 1 nanometer to about 1,000 nanometers. In an alternative embodiment, the thickness can have a range of about 10 nanometers to about 200 nanometers.

In the exemplary embodiments of the present disclosure, the multi-cation oxide material can include compounds of at least one metal cation from a first group Cu, Ag, and Sb; and at least one metal cation selected from the group of the remaining cations in the first group or one of a second group consisting of Zn, Cd, Ga, In, Ge, Sn, and Pb. The precursor compounds for the metal cations described above are typically mononuclear (i.e., monomers in that they contain one metal per molecule), although weakly bound dimers (i.e., dimers containing two monomers weakly bonded together through hydrogen or dative bonds) are also possible. In additional embodiments of the present disclosure, the precursor compounds used for forming the multi-cation oxide can include organometallic compounds suitable for vapor deposition such as silver acetylacetonate ($C_5H_7AgO_2$).

As discussed herein, the precursor compounds used for forming the multi-cation oxide channel in a sputtering process in the embodiments of the present disclosure can include two, three, four, and five-cation oxides. For example, a two-cation oxide such as copper-lead oxide can be used as a target to form the channel. The precursor compounds used for forming the multi-cation oxide channel in a sputtering process in the embodiments of the present disclosure can also include metal alloys containing one or more of the two, three, four, or five cations as appropriate for the desired multi-cation oxide.

Additionally, certain compounds of the Cu, Pb, or Sb cations can be expected to exhibit useful charge carrier transport in the amorphous state. As such, a desirable level of performance can be achieved without crystallization of the multi-cation oxide. Thus, in various embodiments, for example, the copper-lead oxide can have a substantially amorphous form. For example, the copper-lead oxide can include an atomic composition of copper(x):lead (1−x), where x is in the range of about 0.01 to about 0.99. This atomic composition does not take into consideration the optional presence of oxygen and other elements. It is merely a representation of the relative ratio of copper and lead. In an additional embodiment, x can be in the range of about 0.1 to about 0.9, and in the range of about 0.05 to about 0.95.

Sputtering or chemical vapor deposition processes can be carried out in an atmosphere of inert gas and/or a reaction gas to form a relatively pure multi-cation oxide channel. The inert gas is typically selected from the group including helium, neon, argon, and mixtures thereof. In the context of the present disclosure, the inert gas is one that is generally un-reactive with the precursor compounds described herein and does not interfere with the formation of a multi-cation oxide channel.

The reaction gas can be selected from a wide variety of gases reactive with the precursor compounds described herein, at least at a surface under the conditions of deposition. Examples of reaction gases include hydrogen and oxidizing gases such as $O_2$. Various combinations of carrier gases and/or reaction gases can be used in the embodiments of the present disclosure to form the multi-cation oxide channel.

For example, in a sputtering process for the multi-cation oxide channel, the process may be performed by using a mixture of argon and oxygen as the sputtering gas at a particular flow rate, with the application of an RF power for achieving the desired deposition in a sputter deposition chamber. However, it should be readily apparent that any manner of forming the multi-cation oxide channel is contemplated in accordance with the present disclosure and is in no manner limited to any particular process, e.g., sputtering, for formation thereof.

Figure 4:
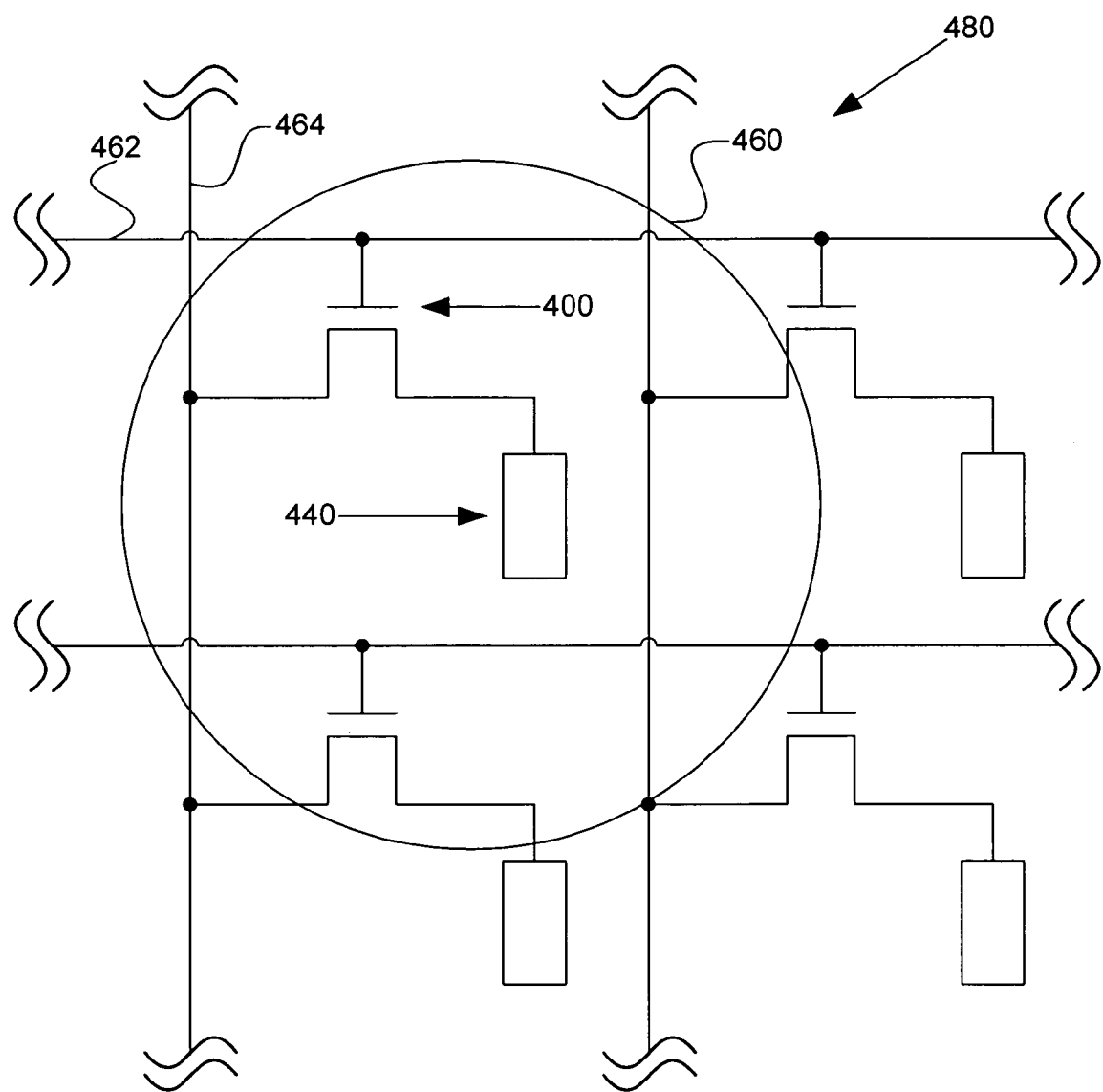
FIG. 4 illustrates an embodiment of an active matrix display area, according to one exemplary embodiment.

With a channel deposited (step 320), both a gate electrode and a gate dielectric positioned between the gate electrode and the channel can be provided in forming an embodiment of the thin-film transistor of the present disclosure (step 330). The embodiments described herein may be used for fabricating chips, integrated circuits, monolithic devices, semiconductor devices, and microelectronic devices, such as display devices. For example, FIG. 4 illustrates an embodiment of a display device such as an active-matrix liquid-crystal display (AMLCD) (480). In FIG. 4, the AMLCD (480) can include pixel devices (i.e., liquid crystal elements) (440) in a matrix of a display area (460). The pixel devices (440) in the matrix can be coupled to thin-film transistors (400) also located in the display area (460). The thin-film transistor (400) can include embodiments of the thin-film transistors as disclosed herein. Additionally, the AMLCD (480) can include orthogonal control lines (462) and (464) for supplying an addressable signal voltage to the thin-film transistors (400) to influence the thin-film transistors to turn on and off and control the pixel devices (440), e.g., to provide an image on the AMLCD (480).

In conclusion, the present system and method for forming a semiconductor device that contains a multi-cation channel including at least two cations to form various two, three, four, and/or five-cation oxide semiconductor films. The at least two cations include at least one metal cation from the group Cu, Ag, and Sb. By forming a multi-cation channel including at least two cations to form various two, three, four and/or five-cation oxide semiconductor films as described above, the semiconductor devices may exhibit excellent charge carrier transport in the amorphous state without crystallization and/or substantial transparency for electronics applications, and/or may yield enhanced flexibility in attaining a range of material properties such as mobility, chemical stability, and/or optical transparency while adding the flexibility to be deposited by any number of solution-based deposition methods.

The preceding description has been presented only to illustrate and describe exemplary embodiments of the present system and method. It is not intended to be exhaustive or to limit the system and method to any precise form disclosed. Many modifications and variations are possible in light of the above teaching. It is intended that the scope of the system and method be defined by the following claims.

What is claimed is:

1. A semiconductor device, comprising:
a gate electrode;
a drain electrode;
a source electrode;
a channel contacting the drain electrode and the source electrode, wherein the channel includes one or more compounds of the formula $A_xB_xO_x$, wherein each A is selected from the group of Cu, Ag, Sb, each B is selected from the group of Cu, Ag, Sb, Zn, Cd, Ga, In, Ge, Sn, Pb, each O is atomic oxygen, each x is independently a non-zero integer, and each of A and B are different; and
a gate dielectric positioned between the gate electrode and the channel.

2. The semiconductor device of claim 1, wherein the one or more compounds of the formula $A_xB_xO_x$ includes a ratio of $A_x:B_x$ wherein a quantity $A_x$ and a quantity $B_x$ are each in a range of about 0.05 to about 0.95.

3. The semiconductor device of claim 1, wherein the channel includes one of an amorphous form, a single-phase crystalline form, or a mixed-phase crystalline form.

4. The semiconductor device of claim 1, wherein the metal oxide includes one or more of copper-zinc oxide, copper-cadmium oxide, copper-gallium oxide, copper-indium oxide, copper-germaniun oxide, copper-tin oxide, copper-lead oxide, copper-silver oxide, copper-antimony oxide, silver-zinc oxide, silver-cadmium oxide, silver-gallium oxide, silver-indium oxide, silver-geranium oxide, silver-tin oxide, silver-lead oxide, silver-antimony oxide, antimony-zinc oxide, antimony-cadmium oxide, antimony-gallium oxide, antimony-indium oxide, antimony-germanium oxide, antimony-tin oxide, or antimony-lead oxide.

5. The semiconductor device of claim 4, wherein the metal oxide includes an atomic composition of ratio $A_x$:$B_x$, wherein a quantity $A_x$ and a quantity $B_x$, are each in a range of about 0.05 to about 0.95.

6. The semiconductor device of claim 1, wherein the one or more compounds of the formula $A_xB_xO_x$ further includes $C_x$, to form one or more compounds of the formula $A_xB_xC_xO_x$, wherein each C is selected from the group of Cu, Ag, Sb, Zn, Cd, Ga, In, Ge, Sn, Pb, each O is atomic oxygen, each x is independently a non-zero integer, and wherein each of A, B, and C are different.

7. The semiconductor device of claim 6, wherein the one or more compounds of the formula $A_xB_xC_xO_x$ includes a ratio of $A_x$:$B_x$:$C_x$, wherein a quantity $A_x$, a quantity $B_x$, and a quantity $C_x$, are each in a range of about 0.025 to about 0.95.

8. The semiconductor device of claim 6, wherein the one or more compounds of formula $A_xB_xC_xO_x$ further includes $D_x$, to form at least one compound of the formula $A_xB_xC_xD_xO_x$ wherein each D is selected from the group of Cu, Ag, Sb, Zn, Cd, Ga, In, Ge, Sn, and Pb, each O is atomic oxygen, each x is independently a non-zero integer, and wherein each of A, B, C, and D are different.

9. The semiconductor device of claim 8, wherein the one or more compounds of the formula $A_xB_xC_xD_xO_x$ includes a ratio of $A_x$:$B_x$:$C_x$:$D_x$, wherein a quantity $A_x$, a quantity $B_x$, a quantity $C_x$, and a quantity $D_x$, are each in a range of about 0.017 to about 0.95.

10. The semiconductor device of claim 8, wherein the one or more compounds of formula $A_xB_xC_xD_xO_x$ further includes $E_x$, to form at least one compound of the formula $A_xB_xC_xD_xE_xO_x$ wherein each E is selected from the group of Cu, Ag, Sb, Zn, Cd, Ga, In, Ge, Sn, and Pb, each O is atomic oxygen, each x is independently a non-zero integer, and wherein each of A, B, C, D, and E are different.

11. The semiconductor device of claim 10, wherein the one or more compounds of the formula $A_xB_xC_xD_xE_xO_x$ includes a ratio of $A_x$:$B_x$:$C_x$:$D_x$:$E_x$, wherein a quantity $A_x$, a quantity $B_x$, a quantity $C_x$, a quantity $D_x$, and a quantity $E_x$, are each in a range of about 0.013 to about 0.95.

12. The semiconductor device of claim 1, wherein the metal oxide comprises a copper-silver-antimony oxide.

13. The semiconductor device of claim 12, wherein the metal oxide includes an atomic composition of ratio $A_x$:$B_x$:$C_x$, wherein a quantity $A_x$, a quantity $B_x$, and a quantity are each in a range of about 0.025 to about 0.95.

14. A semiconductor device formed by the steps, comprising:
   providing a drain electrode;
   providing a source electrode;
   providing a precursor composition including one or more precursor compounds of the formula $A_xB_xO_x$, wherein each A is selected from the group of Cu, Ag, Sb, each B is selected from the group of Cu, Ag, Sb, Zn, Cd, Ga, In, Ge, Sn, Pb, each O is atomic oxygen and wherein each x is independently a non-zero integer, and wherein each of A and B are different;
   depositing a channel including the precursor composition to form a multi-cation oxide from the precursor composition to electrically couple the drain electrode and the source electrode;
   providing a gate electrode; and
   providing a gate dielectric positioned between the gate electrode and the channel.

15. The semiconductor device of claim 14, wherein the one or more precursor compounds includes one or more precursor compounds that include $C_x$, wherein each C is selected from the group of Cu, Ag, Sb, Zn, Cd, Ga, In, Ge, Sn, Pb, each x is independently a non-zero integer, and wherein each of A, B, and C are different.

16. The semiconductor device of claim 15, wherein the one or more precursor compounds includes one or more precursor compounds that include $D_x$, wherein each D is selected from the group of Cu, Ag, Sb, Zn, Cd, Ga, In, Ge, Sn, Pb, each x is independently a non-zero integer, and wherein each of A, B, C, and D are different.

17. The semiconductor device of claim 16, wherein the one or more precursor compounds includes one or more precursor compounds that include $E_x$, wherein each E is selected from the group of Cu, Ag, Sb, Zn, Cd, Ga, In, Ge, Sn, Pb, each x is independently a non-zero integer, and wherein each of A, B, C, D, and E are different.

18. The semiconductor device of claim 17, wherein depositing the channel includes vaporizing the precursor composition to form a vaporized precursor composition, and depositing the vaporized precursor composition using a physical vapor deposition technique including one or more of dc sputtering, dc-pulsed sputtering, rf sputtering, magnetron sputtering, ion beam sputtering, and reactive sputtering.

19. The semiconductor device of claim 14, wherein providing the source, the drain, and the gate electrodes includes providing a substantially transparent form of the source, the drain, and the gate electrodes.

20. The semiconductor device of claim 14, wherein providing the precursor composition includes providing a liquid form of the precursor composition.

21. The semiconductor device of claim 20, wherein depositing the channel includes an ink-jet deposition technique when the precursor composition includes the liquid form.

22. A method for operating a semiconductor device, comprising:
   providing a semiconductor device that includes a source electrode, a drain electrode, a channel to electrically couple the source electrode and the drain electrode, and a gate electrode separated from the channel by a gate dielectric, wherein the channel includes a multi-cation oxide with at least one metal cation selected from the group Cu, Ag, Sb, and at least a second metal cation from the group Cu, Ag, Sb, Zn, Cd, Ga, In, Ge, Sn, and Pb, wherein each cation in the multi-cation oxide is different; and
   applying a voltage to the gate electrode to effect a flow of charge carriers through the channel.

23. The method of claim 22, wherein operating the semiconductor device includes using the semiconductor device as a switch in a display device.

24. The method of claim 22, wherein operating the semiconductor device includes conducting carriers through the channel in a linear region of operation.

25. A display device, comprising:
   a plurality of pixel devices configured to operate collectively to display images, where each of the pixel devices includes a semiconductor device configured to control light emitted by the pixel device, the semiconductor device including:
   a drain electrode;
   a source electrode;
   a channel contacting the drain electrode and the source electrode, wherein the channel includes one or more compounds of the formula $A_xB_xO_x$, wherein each A is selected from the group of Cu, Ag, Sb, each B is selected from the group of Cu, Ag, Sb, Zn, Cd, Ga, In, Ge, Sn, Pb, each O is atomic oxygen, each x is independently a non-zero integer, and wherein each of A and B are different;

a gate electrode; and a gate dielectric positioned between the gate electrode and the channel and configured to permit application of an electric field to the channel.

26. The display of claim 25, wherein the source, the drain, and the gate electrodes include a substantially transparent material.

27. The display of claim 25, wherein the one or more compounds of the formula $A_xB_xO_x$ includes an atomic composition of ratio $A_x:B_x$, wherein a quantity $A_x$, and a quantity $B_x$, are each in a range of about 0.05 to about 0.95.

28. The display of claim 25, wherein the one or more compounds of the formula $A_xB_xO_x$ includes $C_x$, to form a compound of the formula $A_xB_xC_xO_x$, wherein each C is selected from the group of Cu, Ag, Sb, Zn, Cd, Ga, In, Ge, Sn, Pb, each O is atomic oxygen, each x is independently a non-zero integer, and wherein each of A, B, and C are different.

29. The display of claim 28, wherein the one or more compounds of the formula $A_xB_xC_xO_x$ includes an atomic composition of ratio $A_x:B_x:C_x$, wherein a quantity $A_x$, a quantity $B_x$, and a quantity $C_x$, are each in a range of about 0.025 to about 0.95.

30. The display of claim 28, wherein the one or more compounds of formula $A_xB_xC_xO_x$, includes $D_x$, to form a compound of the formula $A_xB_xC_xD_{Ox}$, wherein each D is selected from the group of Cu, Ag, Sb, Zn, Cd, Ga, In, Ge, Sn, Pb, each O is atomic oxygen, each x is independently a non-zero integer, and wherein each of A, B, C, and D are different.

31. The display of claim 30, wherein the one or more compounds of the formula $A_xB_xC_xD_xO_x$ includes an atomic composition of ratio $A_x:B_x:C_x:D_x$, wherein a quantity $A_x$, a quantity $B_x$, a quantity $C_x$, and a quantity $D_x$, are each in a range of about 0.017 to about 0.95.

32. The display of claim 30, wherein the one or more compounds of formula $A_xB_xC_xD_xO_x$ includes $E_x$, to form a compound of the formula $A_xB_xC_xD_xE_xO_x$, wherein each E is selected from the group of Cu, Ag, Sb, Zn, Cd, Ga, In, Ge, Sn, and Pb, each O is atomic oxygen, each x is independently a non-zero integer, and wherein each of A, B, C, D, and E are different.

33. The display of claim 32, wherein the one or more compounds of the formula $A_xB_xC_xD_xE_xC_xO_x$ includes an atomic composition of ratio of $A_x:B_x:C_x:D_x:E_x$, wherein a quantity $A_x$, a quantity $B_x$, a quantity $C_x$, a quantity $D_x$, and a quantity $E_x$, are each in a range of about 0.013 to about 0.95.

34. The display of claim 25, wherein the channel includes one of an amorphous form, a single-phase crystalline form, and a mixed-phase crystalline form.

* * * * *

UNITED STATES PATENT AND TRADEMARK OFFICE
CERTIFICATE OF CORRECTION

PATENT NO. : 7,309,895 B2
APPLICATION NO. : 11/043647
DATED : December 18, 2007
INVENTOR(S) : Randy Hoffman et al.

It is certified that error appears in the above-identified patent and that said Letters Patent is hereby corrected as shown below:

In column 2, line 51, after "FIGS." delete "1F" and insert -- 1E --, therefor.

In column 3, line 58, delete "(262)" and insert -- (202) --, therefor.

In column 5, line 34, after "cation" insert -- oxides formed from the selection of at least one metal cation from the --.

In column 11, line 31, delete "$Sb_4O_1O$" and insert -- $Sb_4O_{10}$ --, therefor.

In column 12, line 45, after "includes" delete "A," and insert -- $A_X$ --, therefor.

In column 14, line 52, in Claim 2, after "$A_x$: $B_x$" insert -- , --.

In column 14, line 52, in Claim 2, after "$B_x$" insert -- , --.

In column 14, line 60, in Claim 4, delete "germaniun" and insert -- germanium --, therefor.

In column 14, line 63, in Claim 4, delete "geranium" and insert -- germanium --, therefor.

In column 15, line 20, in Claim 8, after "$C_xD_xO_x$" insert -- , --.

In column 15, line 32, in Claim 10, after "$A_xB_xC_xD_xE_xO_x$" insert -- , --.

In column 15, line 45, in Claim 13, after "quantity" insert -- $C_x$, --.

In column 18, line 1, in Claim 30, delete "$A_xB_XC_xD_{ox}$" and insert -- $A_xB_XC_xD_xO_x$ --, therefor.

UNITED STATES PATENT AND TRADEMARK OFFICE
CERTIFICATE OF CORRECTION

PATENT NO. : 7,309,895 B2
APPLICATION NO. : 11/043647
DATED : December 18, 2007
INVENTOR(S) : Randy Hoffman et al.

It is certified that error appears in the above-identified patent and that said Letters Patent is hereby corrected as shown below:

In column 18, line 19, in Claim 33, delete "$A_xB_xC_xD_xE_xC_xO_x$" and insert -- $A_xB_xC_xD_xE_xO_x$ --, therefor.

Signed and Sealed this

Eleventh Day of November, 2008

JON W. DUDAS
*Director of the United States Patent and Trademark Office*